(12) United States Patent
Cihangir et al.

(10) Patent No.: US 10,491,193 B2
(45) Date of Patent: Nov. 26, 2019

(54) CIRCUIT FOR SUPPRESSING SIGNALS ADJACENT TO A PASSBAND

(71) Applicant: Qorvo US, Inc., Greensboro, NC (US)

(72) Inventors: Aykut Cihangir, Munich (DE); Andreas Link, Laaber (DE)

(73) Assignee: Qorvo US, Inc., Greensboro, NC (US)

( * ) Notice: Subject to any disclaimer, the term of this patent is extended or adjusted under 35 U.S.C. 154(b) by 34 days.

(21) Appl. No.: 15/592,319

(22) Filed: May 11, 2017

(65) Prior Publication Data
US 2017/0331454 A1 Nov. 16, 2017

Related U.S. Application Data

(60) Provisional application No. 62/336,518, filed on May 13, 2016.

(51) Int. Cl.
*H03B 1/00* (2006.01)
*H03H 9/60* (2006.01)
(Continued)

(52) U.S. Cl.
CPC ............. *H03H 9/605* (2013.01); *H03F 1/565* (2013.01); *H03F 3/19* (2013.01); *H03F 3/245* (2013.01);
(Continued)

(58) Field of Classification Search
CPC ........ H03H 9/725; H03H 9/0576; H03H 9/72; H03H 9/706; H03H 9/6483
(Continued)

(56) References Cited

U.S. PATENT DOCUMENTS

| 7,573,354 B2* | 8/2009 | Nishihara | H03H 9/605 |
| | | | 333/133 |
| 2007/0024392 A1* | 2/2007 | Inoue | H03H 9/0576 |
| | | | 333/133 |

(Continued)

OTHER PUBLICATIONS

Li, Mingdong et al., "A Fully Matched LTE-A Carrier Aggregation Quadplexer Based on BAW and SAW Technologies," IEEE International Ultrasonics Symposium Proceedings, Sep. 3-6, 2014, Chicago, IL, USA, IEEE, pp. 77-80.

(Continued)

*Primary Examiner* — Anh Q Tra
(74) *Attorney, Agent, or Firm* — Withrow & Terranova, P.L.L.C.

(57) ABSTRACT

A circuit having a power amplifier port, an antenna port, and a ladder network coupled between the power amplifier and antenna ports is disclosed. The ladder network includes a proximal series acoustic resonator coupled to the power amplifier port, a distal series acoustic resonator coupled to the antenna port, and at least one series acoustic resonator coupled between the proximal series acoustic resonator and the distal series acoustic resonator. A first shunt acoustic resonator is coupled between a fixed voltage node and the proximal series acoustic resonator and the at least one series acoustic resonator. A second shunt acoustic resonator is coupled between the fixed voltage node and a second node to which the at least one series acoustic resonator is also coupled. A first inductor is coupled in parallel with the proximal series acoustic resonator to create notches below and above a passband of the ladder network.

25 Claims, 8 Drawing Sheets

(51) Int. Cl.
*H03F 3/24* (2006.01)
*H03F 3/19* (2006.01)
*H03F 1/56* (2006.01)
*H03H 9/54* (2006.01)
*H03H 9/64* (2006.01)

(52) U.S. Cl.
CPC .......... *H03H 9/542* (2013.01); *H03H 9/6483* (2013.01); *H03F 2200/171* (2013.01); *H03F 2200/451* (2013.01)

(58) Field of Classification Search
USPC .......................... 327/551–559; 333/133, 195
See application file for complete search history.

(56) References Cited

U.S. PATENT DOCUMENTS

| | | | | |
|---|---|---|---|---|
| 2007/0279154 A1* | 12/2007 | Taniguchi | ................ | H03H 3/02 |
| | | | | 333/189 |
| 2008/0055021 A1* | 3/2008 | Ueda | ...................... | H03H 9/562 |
| | | | | 333/189 |
| 2011/0227807 A1* | 9/2011 | Iwaki | ................... | H03H 9/0571 |
| | | | | 343/850 |
| 2012/0139664 A1* | 6/2012 | Kim | ....................... | H03H 9/542 |
| | | | | 333/189 |
| 2014/0145800 A1* | 5/2014 | Jian | ........................ | H03H 9/542 |
| | | | | 333/189 |
| 2016/0218696 A1* | 7/2016 | Nosaka | ................ | H03H 9/6483 |
| 2016/0322956 A1* | 11/2016 | Takeuchi | ............. | H03H 9/0542 |

OTHER PUBLICATIONS

Novgorodov, V. et al., "Modified Ladder-Type 2.4GHz SAW Filter with Transmission Zero," IEEE International Ultrasonics Symposium Proceedings, Oct. 11-14, 2010, San Diego, CA, USA, IEEE, pp. 2083-2086.

Shirakawa, Alexandre A. et al., "A Mixed Ladder-Lattice Bulk Acoustic Wave Duplexer for W-CDMA Handsets," IEEE International Conference on Electronics, Circuits and Systems (ICECS), Dec. 11-14, 2007, Marrakech, Morocco, IEEE, 4 pages.

* cited by examiner

CIRCUIT FOR SUPPRESSING SIGNALS ADJACENT TO A PASSBAND

RELATED APPLICATIONS

This application claims the benefit of provisional patent application Ser. No. 62/336,518, filed May 13, 2016, the disclosure of which is hereby incorporated herein by reference in its entirety.

FIELD OF THE DISCLOSURE

The present disclosure relates to radio frequency filtering, and in particular to a circuit configured to suppress signals that are adjacent to a passband.

BACKGROUND

Evolving mobile communication standards demand increasingly complex techniques to achieve ever-increasing higher data rates. Implementations of the evolving mobile communication standards require minimization of noise entering transceivers and minimization of spurious transmissions to keep pace with the evolving mobile communication standards. Minimization of noise and spurious emissions entering receiver portions of transceivers requires increasingly improved filtering of communication channels and more suppression of unwanted frequencies. As such, circuits within transceivers require increasingly higher out-of-band suppression, without sacrificing in-band performance. What is needed is a circuit for suppressing signals adjacent to a passband that addresses problems associated with providing higher out-of-band suppression.

SUMMARY

A circuit having a power amplifier port, an antenna port, and a ladder network coupled between the power amplifier port and the antenna port is disclosed. The ladder network includes a proximal series acoustic resonator coupled to the power amplifier port, a distal series acoustic resonator coupled to the antenna port, and at least one series acoustic resonator coupled between the proximal series acoustic resonator and the distal series acoustic resonator. A first shunt acoustic resonator is coupled between a fixed voltage node and a first node shared by the proximal series acoustic resonator and the at least one series acoustic resonator. A second shunt acoustic resonator is coupled between the fixed voltage node and a second node to which the at least one series acoustic resonator is also coupled. A first notch inductor is coupled in parallel with the proximal series acoustic resonator to create notches below and above a passband of the ladder network.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
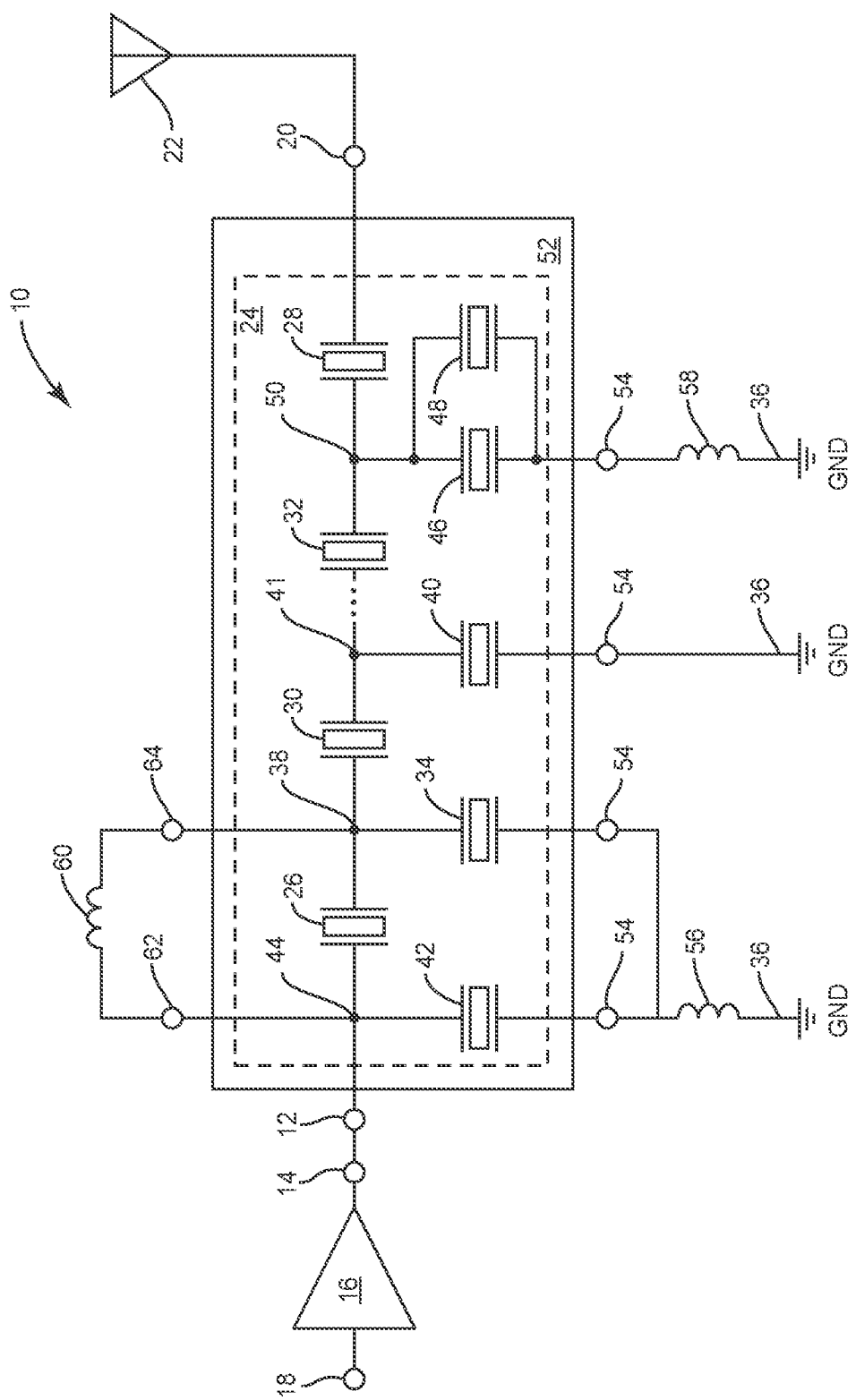
FIG. 1 is a circuit that is structured in accordance with the present disclosure for suppressing signals adjacent to a passband.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is schematic diagram of a circuit 10 that is structured in accordance with the present disclosure for suppressing signals adjacent to a passband using filtering. The circuit 10 includes a power amplifier (PA) port 12 to which an output terminal 14 of a power amplifier (PA) 16 is coupled. Radio frequency (RF) signals that enter an input terminal 18 are amplified by the PA 16 before entering the PA port 12. The circuit 10 also includes an antenna port 20 to which an antenna 22 is coupled. Amplified and filtered RF signals pass through the antenna port 20 and are transmitted from the antenna 22.

A ladder network 24 shown inside a dashed line box is coupled between the PA port 12 and the antenna port 20. The ladder network 24 includes a proximal series acoustic resonator 26 that is coupled to the PA port 12, and a distal series acoustic resonator 28 that is coupled to the antenna port 20. At least one series acoustic resonator 30 is coupled between the proximal series acoustic resonator 26 and the distal series acoustic resonator 28. As indicated by ellipsis, it is to be understood that an additional finite number of series acoustic resonators can be coupled in series between the proximal series acoustic resonator 26 and the distal series acoustic resonator 28. In the exemplary embodiment depicted in FIG. 1, another series acoustic resonator 32 is coupled between the proximal series acoustic resonator 26 and the distal series acoustic resonator 28.

A first shunt acoustic resonator 34 is coupled between a fixed voltage node 36 and a first node 38 that is shared by the proximal series acoustic resonator 26 and the at least one series acoustic resonator 30. A second shunt acoustic resonator 40 is coupled between the fixed voltage node 36 and a second node 41 to which the at least one series acoustic resonator 30 is also coupled. In the exemplary embodiment of FIG. 1, a proximal shunt acoustic resonator 42 is coupled between a proximal node 44 and the fixed voltage node 36. A first distal shunt acoustic resonator 46 and a second distal shunt acoustic resonator 48 are coupled in parallel between a distal node 50 and the fixed voltage node 36. As shown in FIG. 1, the fixed voltage node 36 is at ground potential in at least some embodiments. In the exemplary embodiment of FIG. 1, the ladder network 24 is integrated into a filter die 52. The filter die 52 includes grounding terminals 54. In one embodiment, resonators such as the proximal series acoustic resonator 26 making up the filter die 52 are surface acoustic wave (SAW) resonators. In another embodiment, resonators such as the proximal series acoustic resonator 26 making up the filter die 52 are bulk acoustic wave (BAW) resonators. In yet another embodiment, resonators such as the proximal series acoustic resonator 26 making up the filter die 52 are thin-film bulk acoustic wave resonators (FBARs). In yet another embodiment, resonators such as the proximal series acoustic resonator 26 making up the filter die 52 are solidly mounted resonators.

The circuit 10 does not achieve required suppression levels without using external inductors to produce notch filtering outside of a passband because simply increasing an overall suppression level of the circuit 10 produces a trade-off between overall suppression level and insertion loss. Thus, in this exemplary embodiment, a first grounding inductor 56 is coupled between one of the grounding terminals 54 and the fixed voltage node 36. A second grounding inductor 58 is coupled between another one of the grounding terminals 54 and the fixed voltage node 36.

The first grounding inductor 56 and the second grounding inductor 58 each create a notch-pair. One notch of each notch pair suppresses unwanted frequencies below the passband while the other one notch of each notch pair suppresses unwanted frequencies above the passband. Even so, without adding more grounding inductors the suppression provided by notch-pairs is insufficient for some applications. However, high-frequency suppression provided by the circuit 10 can be lessened to unacceptable levels if inductors are coupled in between all of the grounding terminals 54 and the fixed voltage node 36 because the ladder network 24 floats above the voltage potential of the fixed voltage node 36 at higher frequencies. As a result, harmonics suppression of the PA 16 combined with the ladder network 24 falls outside required transmit signal noise limits. As such at least one of the grounding terminals 54 is not coupled to the fixed voltage node 36 by way of an inductor. In the exemplary embodiment of FIG. 1, one of the grounding terminals 54 associated with the second shunt acoustic resonator 40 is coupled directly to the fixed voltage node 36.

To achieve a desirable suppression of signals adjacent to the passband of the ladder network 24, a first notch inductor 60 is coupled in parallel with the proximal series acoustic resonator 26. The filter die 52 includes a first inductor coupling terminal 62 and a second inductor coupling terminal 64 to which the first notch inductor 60 is coupled.

Figure 2:
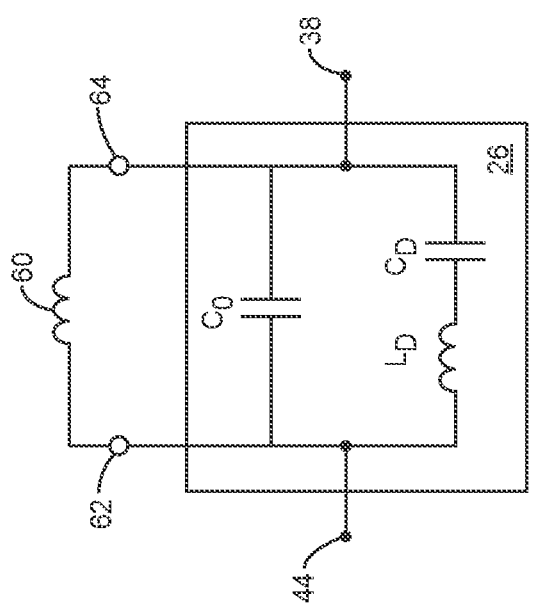
FIG. 2 is a circuit model diagram of the first notch inductor coupled in parallel with a Butterworth Van-Dyke (BVD) electrical model of the proximal series acoustic resonator.

FIG. 2 is a circuit model diagram of the first notch inductor 60 coupled in parallel with the proximal series acoustic resonator 26. The circuit model diagram includes a Butterworth-Van Dyke (BVD) electrical model of the proximal series acoustic resonator 26. A static capacitance $C_O$ of the proximal series acoustic resonator 26 is modelled as being directly coupled in parallel with the first notch inductor 60. The BVD electrical model also includes a dynamic inductance $L_D$ and a dynamic capacitance $C_D$ that are coupled in series, which in turn are coupled in parallel with both the static capacitance $C_O$ and the first notch inductor 60. A model resistance typically coupled in series with the dynamic inductance $L_D$ and the dynamic capacitance $C_O$ is ignored and for simplicity not shown in this particular BVD electrical model.

Figure 3:
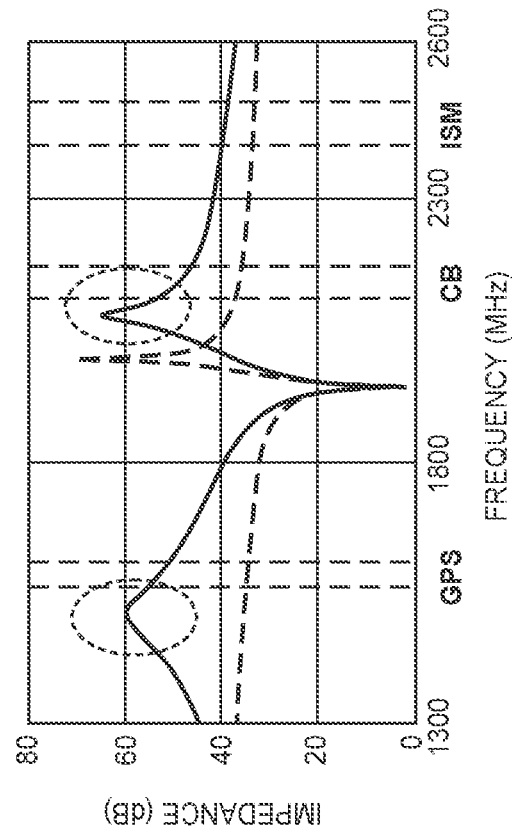
FIG. 3 is a graph of impedance versus frequency with and without the parallel combination of the first notch inductor and the proximal series acoustic resonator using the BVD electrical model of FIG. 2.

FIG. 3 is a graph of impedance versus frequency with and without the parallel combination of the first notch inductor 60 and the proximal series acoustic resonator 26 using the BVD electrical model of FIG. 2. A dashed trace represents impedance of the proximal series acoustic resonator 26 without the parallel combination of the first notch inductor 60 and the proximal series acoustic resonator 26. A solid trace represents impedance due to the parallel combination of the first notch inductor 60 and the proximal series acoustic resonator 26.

In operation, the static capacitance $C_O$ of the proximal series acoustic resonator 26 and the first notch inductor 60 creates a parallel resonance, making practically an open circuit response at a frequency lower than the passband. An inductance value for the first notch inductor 60 can be adjusted to bring the anti-resonance to an intended frequency band such as the global positioning system (GPS) band, which suppresses undesirable blocker signals of the transmit band from interfering with GPS signal reception. See the lower frequency notch within a dashed ellipse shown in the left of center section of FIG. 3. As shown, undesirable blocker signals within the GPS band are suppressed by at least 20 dB more than without adding the first notch inductor 60 in parallel with the proximal series acoustic resonator 26. Moreover additional suppression can be achieved by selecting an inductance value for the first notch inductor 60 that locates the notch directly over the GPS band.

The first notch inductor 60 also shifts the anti-resonance of the proximal series acoustic resonator 26 to a higher frequency. See the higher frequency notch within a dashed ellipse shown in the right of center section of FIG. 3. The anti-resonance frequency of the dynamic inductance $L_D$, the dynamic capacitance $C_D$, and the static capacitance $C_O$ combination is increased by the parallel coupling to the first notch inductor 60. As a result and depending on the band, this shift in the anti-resonance can be used to enhance the counter-band (CB) suppression and thus enhance CB isolation. The CB is the receive frequency band that is counter to the transmit band. The shift in the anti-resonance can also be used to enhance the suppression in unwanted bands above the passband such as the industrial scientific medical (ISM) band because of higher impedance generated above the passband. In at least one embodiment, the inductance of the first notch inductor 60 reduces the effective BVD static capacitance $C_O$ of the proximal series acoustic resonator 26, upshifting the anti-resonance frequency and creating a 2.4 GHz ISM/Wireless Fidelity (WiFi) band. In at least one embodiment, impedance provided by the circuit 10 for the CB of a transmit band is at least −50 dB.

Further still, the addition of the first notch inductor 60 achieves a wider passband for the ladder network 24 (FIG. 1). As previously stated, the anti-resonance of the proximal series acoustic resonator 26 is shifted up, which artificially increases a coupling coefficient of the proximal series acoustic resonator 26. In the absence of the first notch inductor 60, filter bandwidth of the ladder network 24 is limited by the anti-resonance of the proximal series acoustic resonator 26, which creates an "open circuit" response. Thus, utilization of the first notch inductor 60 eliminates this limiting factor.

Figure 4:
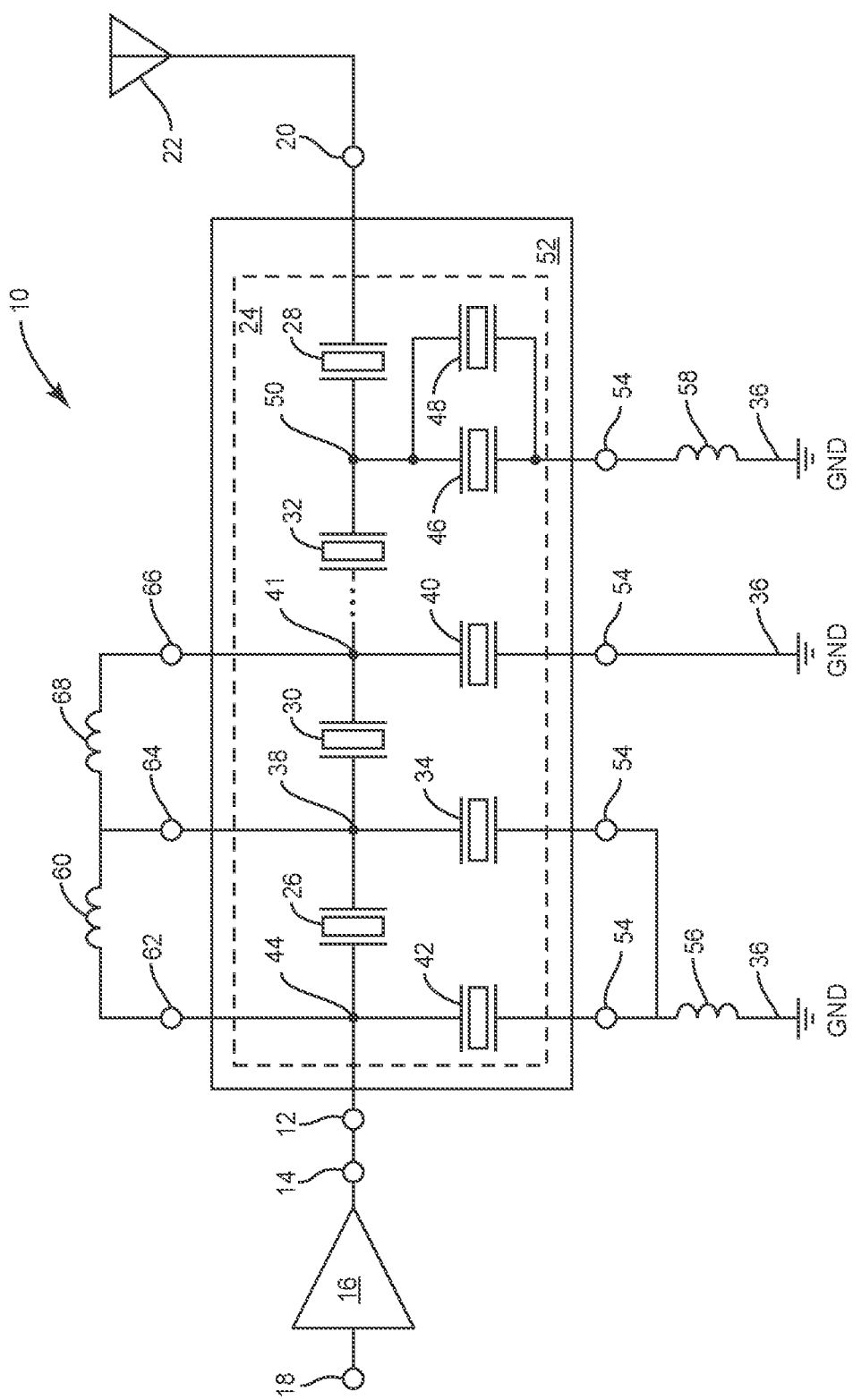
FIG. 4 is another embodiment of the circuit of the present disclosure for suppressing signals adjacent to a passband.

FIG. 4 is another embodiment of the circuit 10 for suppressing signals adjacent to a passband. In this embodiment, the filter die 52 includes a third inductor coupling terminal 66. A second notch inductor 68 is coupled to the second inductor coupling terminal 64 and the third inductor coupling terminal 66 to place the second notch inductor 68 in parallel with the at least one series acoustic resonator 30. In at least one embodiment, the ladder network 24, the first notch inductor 60, and the second notch inductor 68 are integrated into a single die.

Impedance and notch frequencies generated by the addition of the second notch inductor 68 in parallel with the at least one series acoustic resonator 30 are modelled with the BVD electrical model depicted in FIG. 2.

In the remaining FIGS. 5-8, a solid trace represents wideband filter response for a circuit topology similar to circuit 10 of FIG. 1 without the parallel combination of the first notch inductor 60 and the proximal series acoustic resonator 26. In comparison, a dashed trace represents wideband filter response for circuit 10 having the parallel combination of the first notch inductor 60 and the proximal series acoustic resonator 26 of the embodiment of FIG. 1.

Figure 5:
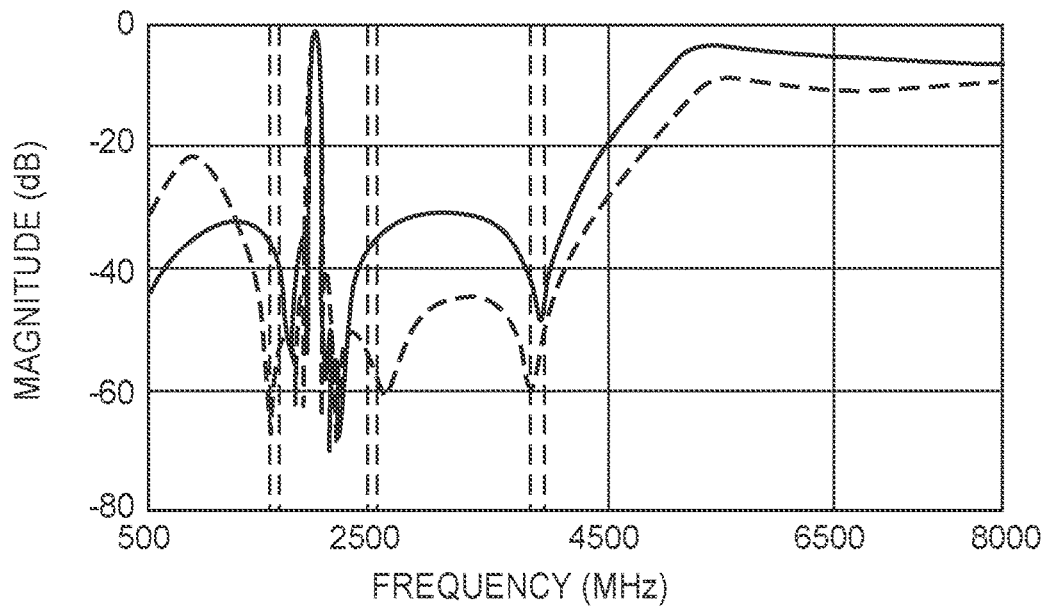
FIG. 5 is a graph of wideband filter responses from a power amplifier port to an antenna port with and without a parallel combination of the first notch inductor and the proximal series acoustic resonator of the embodiment of FIG. 1.

FIG. 5 is a graph of wideband filter responses from the PA port 12 to the antenna port 20 with and without the parallel combination of the first notch inductor 60 and the proximal series acoustic resonator 26 of the embodiment of FIG. 1.

Figure 6:
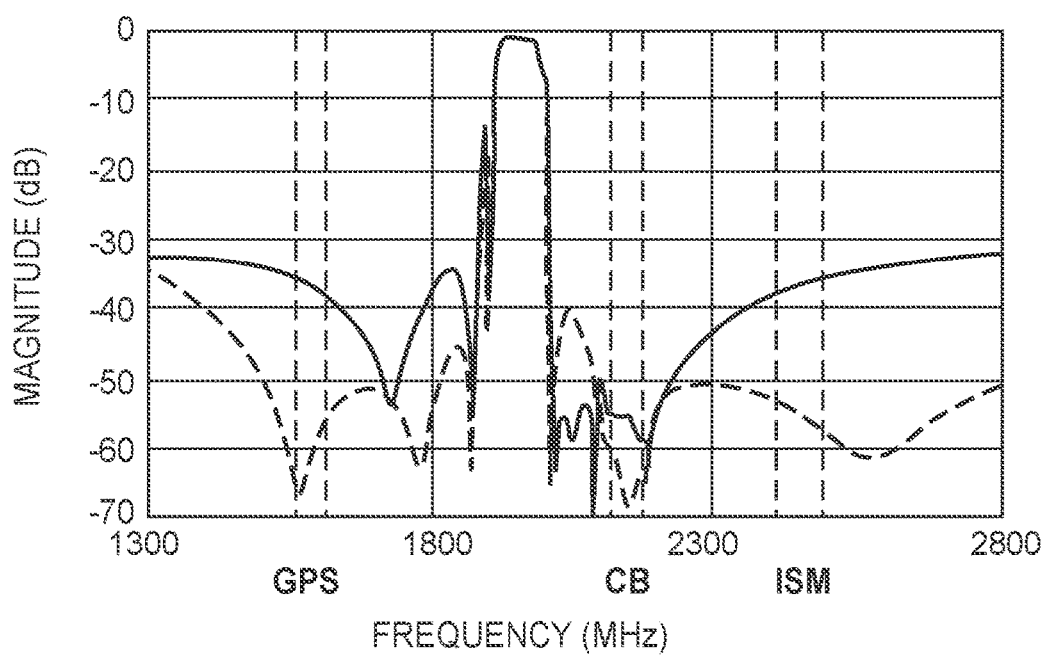
FIG. 6 is a zoomed-in graph of filter responses from a power amplifier port to an antenna port with and without a parallel combination of the first notch inductor and the proximal series acoustic resonator of the embodiment of FIG. 1.

FIG. 6 is a zoomed-in graph of filter responses from the PA port 12 to the antenna port 20 with and without a parallel combination of the first notch inductor and the proximal series acoustic resonator of the embodiment of FIG. 1. Notice that undesirable signals and noise have a relatively higher amount of suppression in the GPS and the ISM band and the CB band with circuit 10 having the parallel combination of the first notch inductor 60 and the proximal series acoustic resonator 26 as opposed to not having the parallel combination of the first notch inductor 60 and the proximal series acoustic resonator 26. In at least one embodiment, out-of-band suppression of unwanted frequencies between 500 MHz and 4 GHz is at least −35 dB. Moreover, in at least one embodiment, a notch impedance of the circuit 10 for a GPS band between 1559 MHz and 1626.5 MHz provides at least −45 dB of unwanted transmit signal suppression at the antenna port 20. Further still, in at least one embodiment, impedance provided by the circuit 10 for the ISM band is between 2.4 GHz and 2.5 GHz and provides at least −45 dB of unwanted transmit signal suppression at the antenna port 20.

Figure 7:
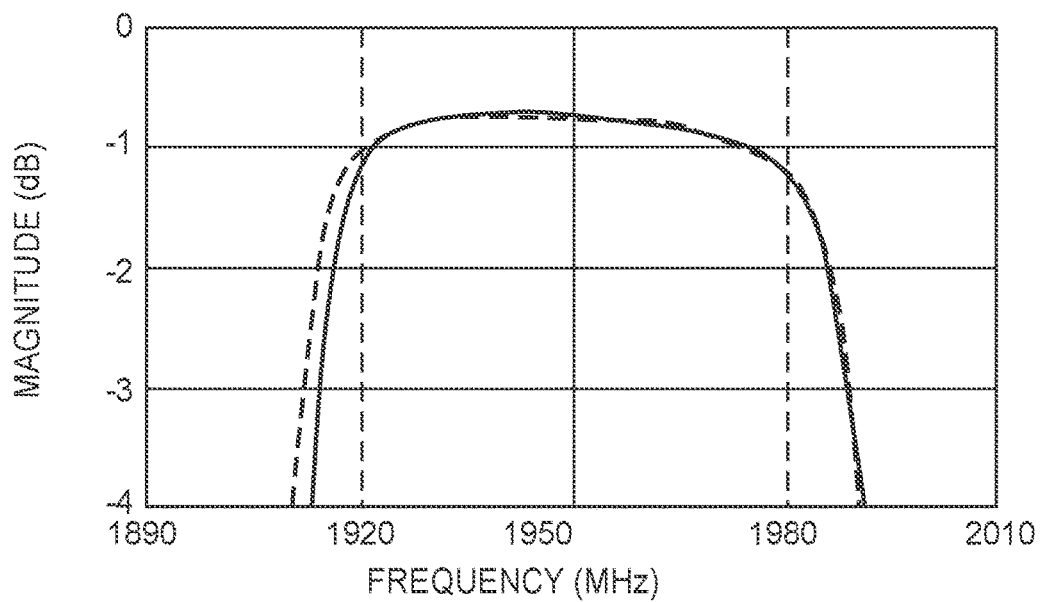
FIG. 7 is a zoomed-in graph of the passband of the embodiment of FIG. 1 with and without a parallel combination of the first notch inductor and the proximal series acoustic resonator.

FIG. 7 is a zoomed-in graph of the passband of the embodiment of FIG. 1 with and without the parallel combination of the first notch inductor and the proximal series acoustic resonator. Notice that the width of the passband is greater with the parallel combination of the first notch inductor 60 and the proximal series acoustic resonator 26. Insertion loss provided by the circuit 10 for the transmit band that is within the passband is between −3 dB and 0 dB.

Figure 8:
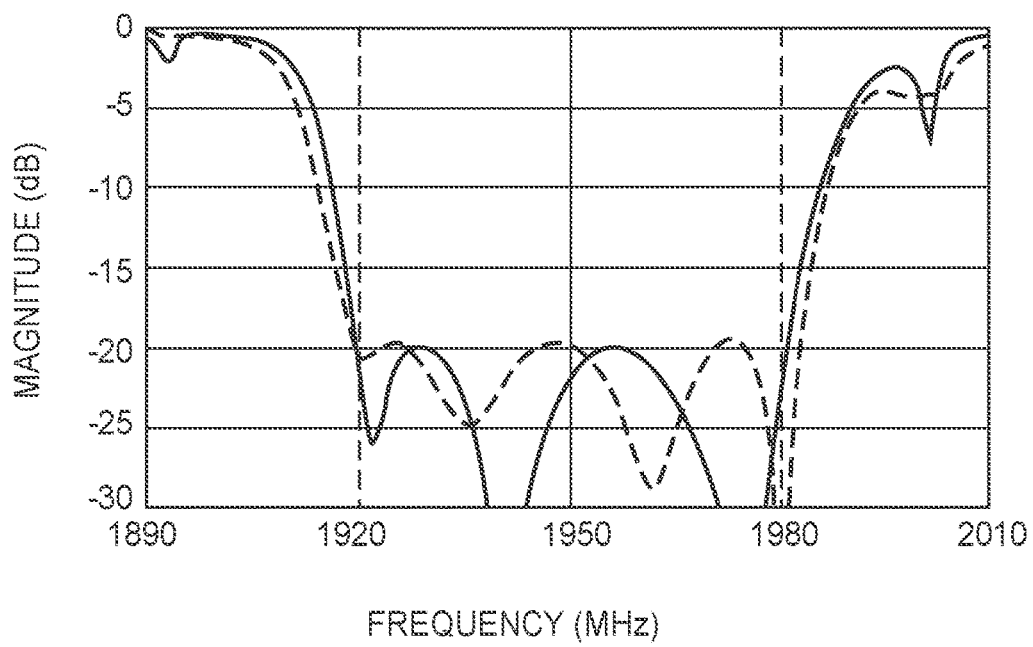
FIG. 8 is a graph of transmit signal return loss at a power amplifier port of the embodiment of FIG. 1 for the passband frequencies with and without the parallel combination of the first notch inductor and the proximal series acoustic resonator.

FIG. 8 is a graph of transmit signal return loss at the PA port 12 of the embodiment of FIG. 1 for the passband frequencies with and without the parallel combination of the first notch inductor and the proximal series acoustic resonator. The return loss remains comparable with the parallel combination of the first notch inductor 60 and the proximal series acoustic resonator 26. Thus, return loss is practically unaffected by the parallel combination of the first notch inductor 60 and the proximal series acoustic resonator 26. In at least one embodiment, transmit signal return loss for a passband between 1920 MHz and 1980 MHz is no more than −15 dB.

As described previously and shown in the FIGS. 5-8, the first notch inductor 60 and the second notch inductor 68 both contribute to deepening the notches on either side of the passband while enhancing or maintaining other performance characteristics such as return loss. However, placing additional notch inductors in parallel with series acoustic resonators such as distal series acoustic resonator 28 coupled close to the antenna port 20 has detrimental effects. In some traditional filter dies, two symmetrical series acoustic resonators are coupled in series in proximity to an antenna port. Such an arrangement is provided to improve acoustic resonator nonlinear behavior. Adding a notch inductor across a series acoustic resonator in relative proximity to the antenna port 20 interferes with effective nonlinear cancellation. For example, adding a notch inductor in parallel with the distal series acoustic resonator 28 in such an arrangement is very undesirable because of an unacceptable increase in nonlinear behavior. Moreover, adding a notch inductor in parallel with the distal series acoustic resonator 28 similarly interferes with nonlinear cancelling effects provided by the parallel coupling of the first distal shunt acoustic resonator 46 and the second distal shunt acoustic resonator 48.

The distal series acoustic resonator 28 and the series acoustic resonator 32 coupled together near the antenna port 20 have an additional role in the performance of the ladder network 24 in configuring impedance at the CB, shown as an open circuit when looking from the antenna port 20. If a notch inductor is coupled across the distal series acoustic resonator, an undesirable additional parameter places restrictions on the values of such a notch inductor, the resonator frequency, and the resonator area, which ultimately limits degrees of freedom needed to place the out-of-band notches within desired bands. Overall, for at least the foregoing reasons, placing a notch inductor in parallel with a series acoustic resonator in proximity to an antenna port such as antenna port 20 creates problems that the circuit 10 eliminates.

An advantage of using the first notch inductor 60 and the second notch inductor 68 is to artificially increase coupling coefficients of the proximal series acoustic resonator 26 and the at least one series acoustic resonator 30, resulting in more bandwidth between a short circuit resonance and anti-resonance. This arrangement provides additional bandwidth for the passband and improves return loss between the filter die 52 and the PA 16.

Further still, impedance matching the ladder network 24 to the PA 16 enhances desired signal transmission through the ladder network 24 because the PA 16 needs flat load line impedance as seen by the PA 16 looking into the PA port 12. Thus, increasing bandwidth of the passband while improving return loss for a given insertion loss consequently improves impedance matching efficiency between the PA 16 and the ladder network 24. Moreover, placing the first notch inductor 60 and the second notch inductor 68 in proximity to the PA port 12 instead of in proximity to the antenna port 20 eliminates a problem of realizing less bandwidth for the passband.

Figure 9:
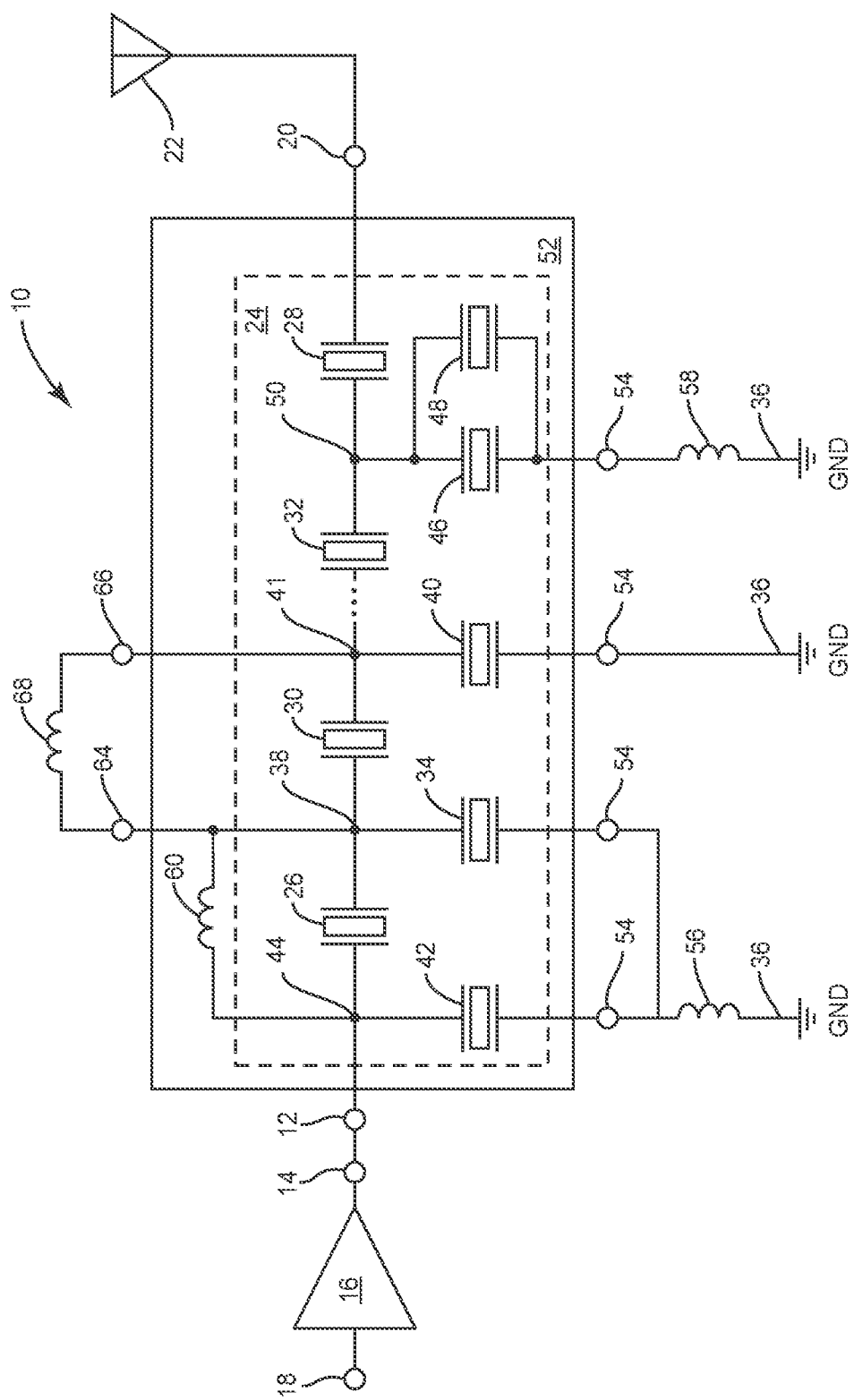
FIG. 9 is another embodiment of the circuit of the present disclosure in which the first notch inductor is integrated with the filter die.
Figure 10:
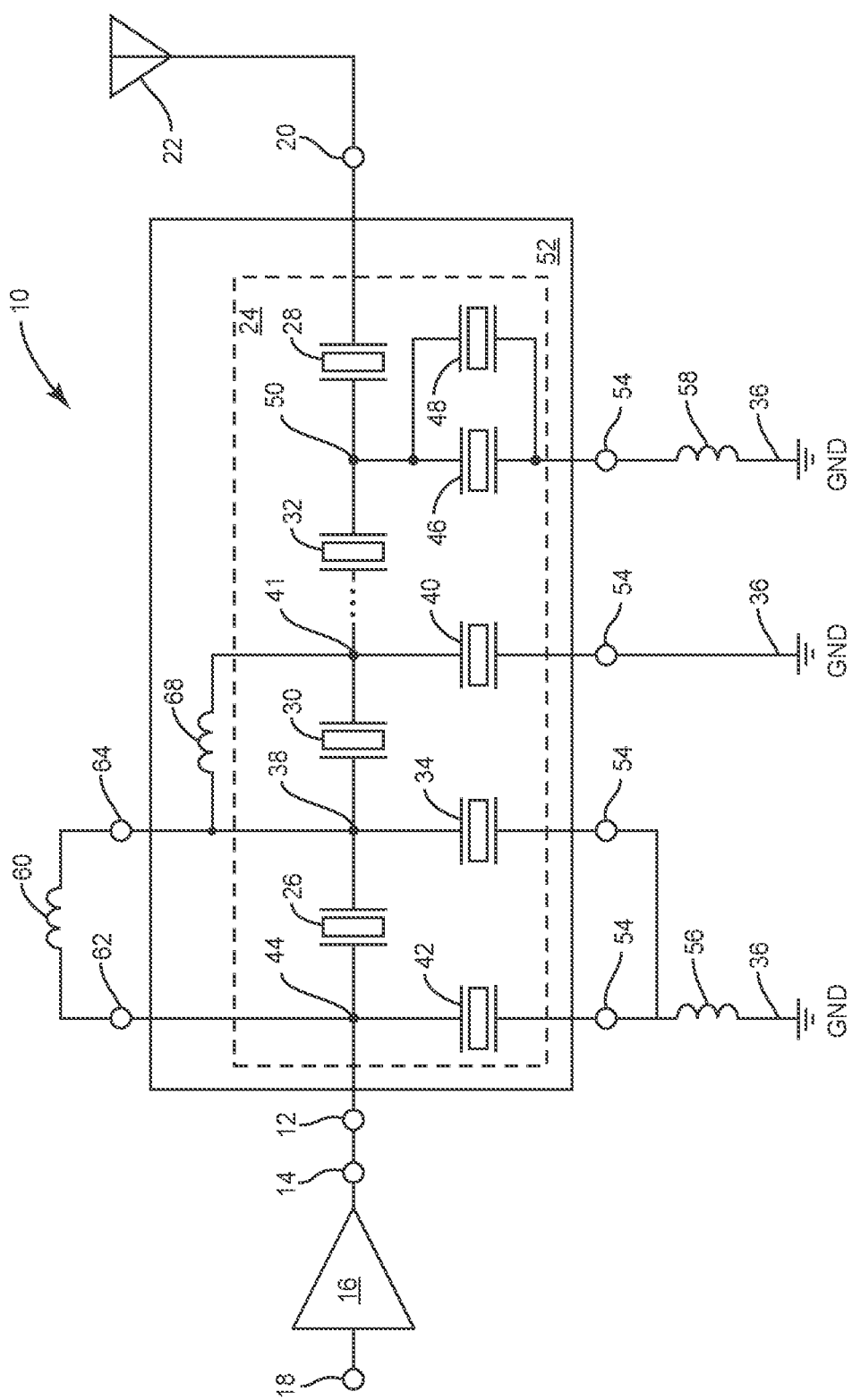
FIG. 10 is another embodiment of the circuit of the present disclosure in which the second notch inductor is integrated with the filter die.
Figure 11:
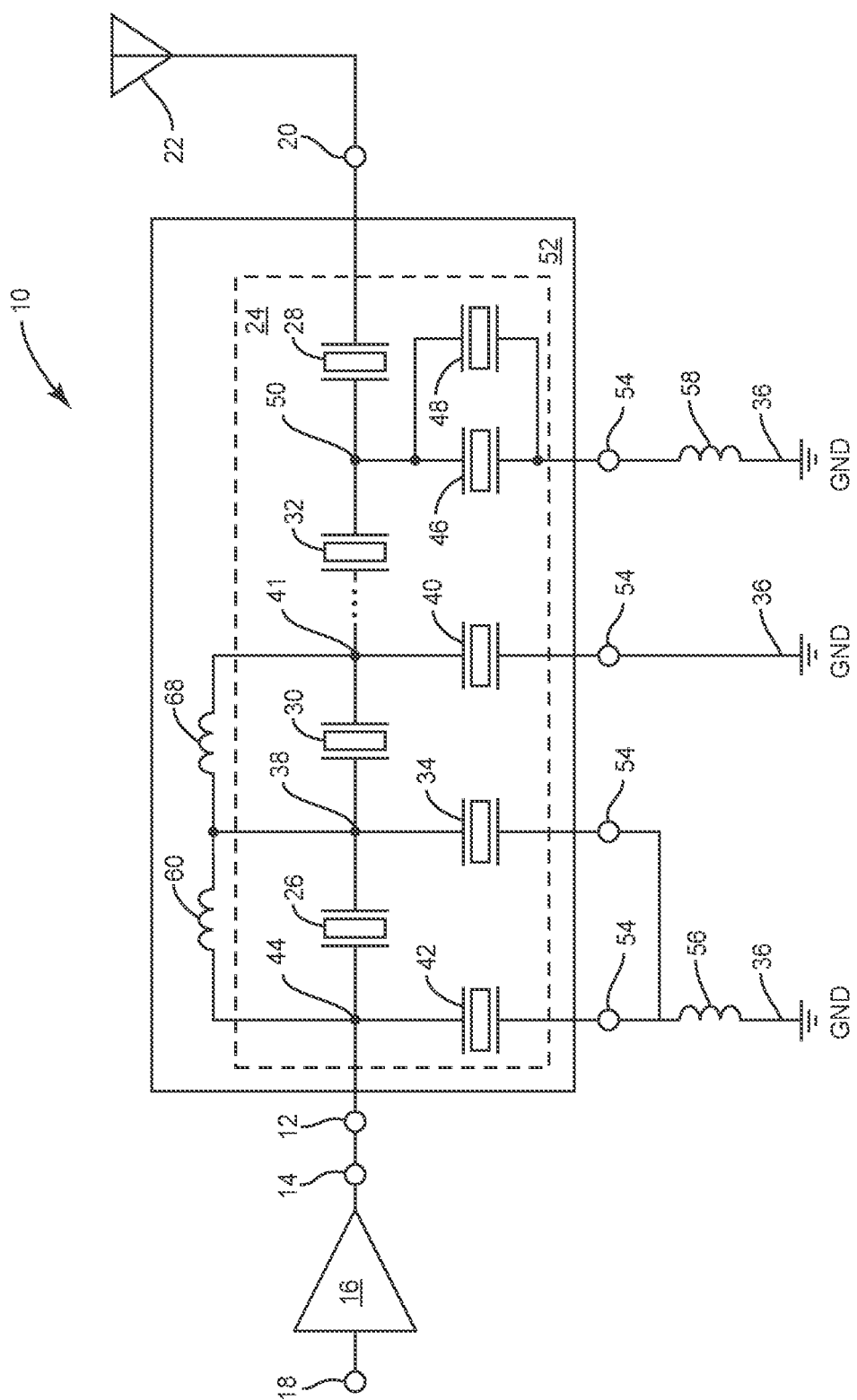
FIG. 11 is another embodiment of the circuit of the present disclosure in which both the first notch inductor and the second notch inductor are integrated with the filter die.

As depicted in FIG. 9, in at least one embodiment, the ladder network 24 and the first notch inductor 60 are integrated into the filter die 52 having a pair of external coupling terminals, in this case second and third inductor coupling terminals 64 and 66, to couple the second notch inductor 68, which in this embodiment is external to the filter die 52, in parallel with the at least one series acoustic resonator 30 closest coupled to the PA port 12. In yet another embodiment depicted in FIG. 10, the ladder network 24 and the second notch inductor 68 are integrated into the filter die 52 having a pair of external coupling terminals, in this case first and second inductor coupling terminals 62 and 64, to couple the first notch inductor 60, which in this embodiment is external to the filter die 52 in parallel with the proximal series acoustic resonator 26. FIG. 11 illustrates that in yet another embodiment, the ladder network 24, the first notch inductor 60, and the second notch inductor 68 are integrated into the filter die 52.

Those skilled in the art will recognize improvements and modifications to the preferred embodiments of the present disclosure. All such improvements and modifications are considered within the scope of the concepts disclosed herein and the claims that follow.

What is claimed is:

1. A circuit comprising a power amplifier port, an antenna port, and a ladder network coupled between the power amplifier port and the antenna port wherein the ladder network comprises:
   a power amplifier having an output terminal coupled to the power amplifier port;
   a proximal series acoustic resonator coupled to the output terminal through the power amplifier port;
   a distal series acoustic resonator coupled to the antenna port, wherein no inductor is coupled in parallel with the distal series acoustic resonator;
   at least one series acoustic resonator coupled between the proximal series acoustic resonator and the distal series acoustic resonator;
   a grounding inductor coupled to a fixed voltage node;
   a first shunt acoustic resonator coupled between the fixed voltage node and a first node shared by the proximal series acoustic resonator and the at least one series acoustic resonator;
   a proximal shunt acoustic resonator coupled in series with the grounding inductor between the power amplifier port and the fixed voltage node;
   a second shunt acoustic resonator coupled between the fixed voltage node and a second node to which the at least one series acoustic resonator is also coupled;
   a first notch inductor coupled in parallel with the proximal series acoustic resonator; and
   a second notch inductor coupled in parallel with the at least one series acoustic resonator adjacent to the proximal series acoustic resonator.

2. The circuit of claim 1 wherein the fixed voltage node is at ground potential.

3. The circuit of claim 1 wherein an antenna is coupled to the antenna port.

4. The circuit of claim 1 wherein the proximal series acoustic resonator, the at least one series acoustic resonator, the distal series acoustic resonator, the first shunt acoustic resonator, and the second shunt acoustic resonator are surface acoustic wave resonators.

5. The circuit of claim 1 wherein the proximal series acoustic resonator, the at least one series acoustic resonator, the distal series acoustic resonator, the first shunt acoustic resonator, and the second shunt acoustic resonator are bulk acoustic wave resonators.

6. The circuit of claim 1 wherein the proximal series acoustic resonator, the at least one series acoustic resonator, the distal series acoustic resonator, the first shunt acoustic resonator, and the second shunt acoustic resonator are thin-film bulk acoustic wave resonators.

7. The circuit of claim 1 wherein the proximal series acoustic resonator, the at least one series acoustic resonator, the distal series acoustic resonator, the first shunt acoustic resonator, and the second shunt acoustic resonator are solidly mounted (acoustic) resonators.

8. The circuit of claim 1 wherein the first notch inductor provides an anti-resonance resonance frequency with a Butterworth Van-Dyke model (BVD) static capacitance of the proximal series acoustic resonator.

9. The circuit of claim 8 wherein an inductance of the first notch inductor combined with the BVD static capacitance creates a notch below a passband of the ladder network.

10. The circuit of claim 9 wherein the inductance of the first notch inductor combined with the BVD static capacitance creates the notch within a global positioning system (GPS) band.

11. The circuit of claim 9 wherein the inductance of the first notch inductor reduces the capacitive effect of the BVD static capacitance of the proximal series acoustic resonator, upshifting an anti-resonance frequency and creating a notch above the passband of the ladder network.

12. The circuit of claim 9 wherein the inductance of the first notch inductor reduces the capacitive effect of the BVD static capacitance of the proximal series acoustic resonator, upshifting the anti-resonance frequency and creating a notch within a counter-band of a transmit band passed by the ladder network.

13. The circuit of claim 9 wherein the inductance of the first notch inductor reduces the capacitive effect of the BVD static capacitance of the proximal series acoustic resonator, upshifting the anti-resonance frequency and creating a 2.4 GHz ISM/wireless fidelity (WiFi) band.

14. The circuit of claim 1 wherein the ladder network is integrated into a single die having a first pair of external pins for coupling the first notch inductor in parallel with the proximal series acoustic resonator, which is coupled to the power amplifier port.

15. The circuit of claim 1 wherein the ladder network and the first notch inductor are integrated into a single die.

16. The circuit of claim 14 further including a second pair of external pins for the second notch inductor coupled in parallel with the at least one series acoustic resonator closest to and coupled to the power amplifier port.

17. The circuit of claim 1 wherein the ladder network, the first notch inductor, and the second notch inductor are integrated into a single die.

18. The circuit of claim 1 wherein the ladder network and the first notch inductor are integrated into a single die having a pair of external coupling terminals to couple the second notch inductor that is external to the die in parallel with the at least one series acoustic resonator closest coupled to the power amplifier port.

19. The circuit of claim 1 wherein the ladder network and the second notch inductor are integrated into a single die having a pair of external coupling terminals to couple the first notch inductor that is external to the die in parallel with the proximal series acoustic resonator.

20. The circuit of claim 1 wherein out-of-band suppression of unwanted frequencies between 500 MHz and 4 GHz is at least −35 dB.

21. The circuit of claim 1 wherein transmit signal return loss for a passband between 1920 MHz and 1980 MHz is no more than −15 dB.

22. The circuit of claim 1 wherein a notch impedance of the circuit for a GPS band between 1559 MHz and 1626.5 MHz provides at least −45 dB of unwanted transmit signal suppression at the antenna port.

23. The circuit of claim 1 wherein impedance provided by the circuit for an industrial scientific and medical (ISM) band between 2.4 GHz and 2.5 GHz provides at least −45 dB of unwanted transmit signal suppression at the antenna port.

24. The circuit of claim 1 wherein impedance provided by the circuit for a counter-band of a transmit band is at least −50 dB.

25. The circuit of claim 24 wherein insertion loss provided by the circuit for the transmit band is between −3 dB and 0 dB.

* * * * *